(12) United States Patent
Nozawa et al.

(10) Patent No.: US 6,677,087 B2
(45) Date of Patent: Jan. 13, 2004

(54) PHASE SHIFT MASK BLANK, PHASE SHIFT MASK, AND METHOD FOR MANUFACTURING THE SAME

(75) Inventors: Osamu Nozawa, Tokyo (JP); Hideaki Mitsui, Tokyo (JP)

(73) Assignee: Hoya Corporation, Tokyo (JP)

( * ) Notice: Subject to any disclaimer, the term of this patent is extended or adjusted under 35 U.S.C. 154(b) by 183 days.

(21) Appl. No.: 09/949,797

(22) Filed: Sep. 12, 2001

(65) Prior Publication Data

US 2002/0061452 A1 May 23, 2002

(30) Foreign Application Priority Data

Sep. 12, 2000 (JP) .................................. P. 2000-276968
Aug. 14, 2001 (JP) .................................. P. 2001-246080

(51) Int. Cl.[7] .............................. G03C 5/00; G03F 9/00
(52) U.S. Cl. ............................................................ 430/5
(58) Field of Search .................. 430/5, 322; 204/192.1, 204/192.11, 192.12; 356/600, 601

(56) References Cited

U.S. PATENT DOCUMENTS 5,955,223 A * 9/1999 Mitsui et al. .................. 430/5

FOREIGN PATENT DOCUMENTS

| JP | 6-214792 | 8/1994 |
| JP | 2878143 | 1/1999 |
| JP | 2989156 | 10/1999 |

OTHER PUBLICATIONS

Ohyo Buturi, vol. 60, No. 11 (1991).
J. Electrochem. Soc., vol. 137, No. 5, pp. 1582–1587.

* cited by examiner

*Primary Examiner*—S. Rosasco
(74) *Attorney, Agent, or Firm*—Sughrue Mion, PLLC (57) ABSTRACT

An object of the present invention is to provide a half-tone phase shift mask blank and a half-tone phase shift mask of which a translucent film has improved acid resistance, alkali resistance and resistance to excimer laser irradiation while maintaining the internal stress of the film within an acceptable range for the intended use. To achieve the aforementioned object, the present invention provides a half-tone phase shift mask blank which comprises a transparent substrate having provided thereon a translucent film comprising at least one thin layer containing silicon and at least one of nitrogen and oxygen and which is to be exposed to light whose center wavelength is 248 nm or shorter, wherein said translucent film is dense such that it has a center-line surface roughness (Ra) of 0.3 nm or smaller.

14 Claims, 2 Drawing Sheets

LIGHT AMPLITUDE
DISTRIBUTION OF MASK

LIGHT STRENGTH
DISTRIBUTION ON
TRANSFERRED BODY

LIGHT AMPLITUDE
DISTRIBUTION OF MASK

FIG. 1 (c)

LIGHT STRENGTH
DISTRIBUTION ON
TRANSFERRED BODY

PHASE SHIFT MASK BLANK, PHASE SHIFT MASK, AND METHOD FOR MANUFACTURING THE SAME

BACKGROUND OF THE INVENTION

1. Field of the Invention

This invention relates to a phase shift mask. More particularly, it relates to an attenuating phase shift mask which attenuates light of exposure wavelength and is suitable for a KrF excimer laser and especially an ArF excimer laser and an $F_2$ excimer laser, a blank therefor, and a process of fabricating the phase shift mask blank.

2. Description of the Related Art

A high resolution and a depth of focus (DOF), which are significant characteristics required in photolithography, conflict with each other. It has been revealed that a resolution cannot be improved simply by increasing the numerical aperture of an optical aligner and shortening the exposure wavelength (see Semiconductor World, vol. 12 (1990) or Ohyo Buturi, vol. 60, No. 11(1991)).

Under these circumstances, phase shift lithography has been attracting attention as a photolithographic technique of next generation and been partly introduced. Phase shift lithography is a technique for improving the resolution in photolithography by alteration to the mask with no alterations to the optical system, in which a phase shift mask is used to change the phase of the light passing through the shifter of the mask so that the light having passed through the shifter and the light not having passed through the shifter are made to interfere with each other thereby to markedly increase the resolution.

A phase shift mask is a mask having light intensity information and phase information and includes a Levenson type, an auxiliary pattern type, and a self-alignment (edge enhancement) type. Compared with ordinary photomasks having only light intensity information, the phase shift masks are structurally complicated and need high technology to produce.

In recent years, half-tone phase shift masks, another type of phase shift mask, have been developed. A half-tone phase shift mask has translucent areas which have a function of substantially blocking light of exposure wavelength combined with a function of shifting (usually reversing) the phase of light. Since there is no need to separately form a light blocking pattern and a phase shifting pattern, the half-tone phase shift mask has a simpler structure and is easier to make.

Patterning of a blank for making a half-tone phase shift mask is achieved by dry etching. Where the light blocking function and the phase shifting function are performed by the respective layers, highly strict control is required for satisfactory patterning for each of the layers. On the other hand, the half-tone phase shift masks, in which single-layer translucent areas perform both of these functions, can be obtained through a single dry etching step. Thus, half-tone phase shift masks can be produced through a simplified process with a satisfactory pattern.

Figure 1:
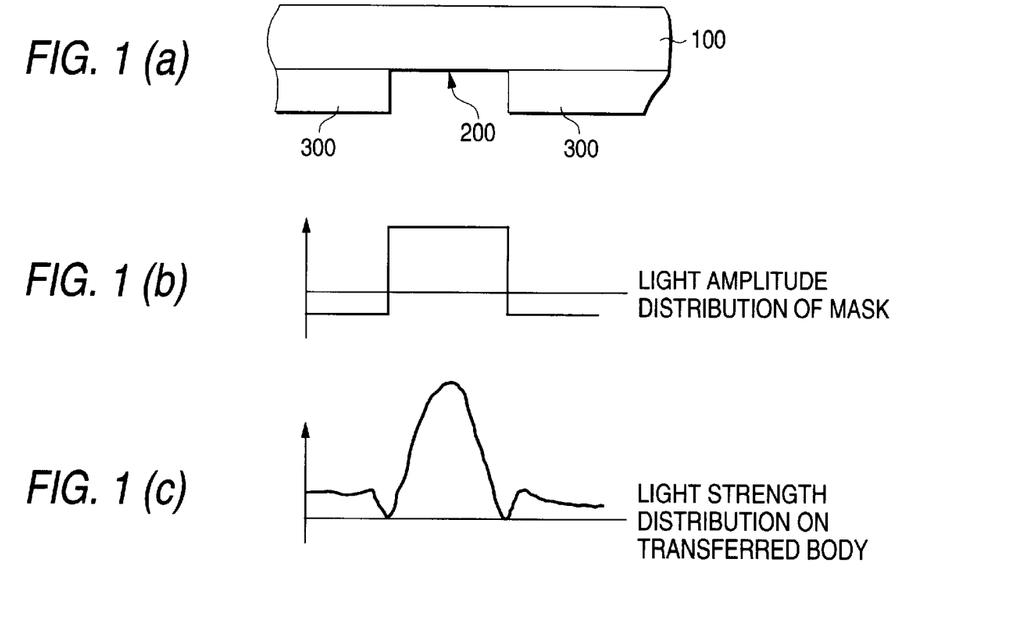
FIG. 1 presents illustrations showing the pattern transfer principle of a half-tone phase shift mask.

As shown in FIG. 1, a half-tone phase shift mask comprises a transparent substrate 100 having formed there on a masking pattern composed of light-transmitting areas (areas where the transparent substrate 100 is exposed) 200 which allow light of intensity contributory to exposure to pass through substantially and translucent areas (light-blocking and phase shifting areas) 300 which allow light of intensity not contributory to exposure to pass through substantially (FIG. 1A). The translucent areas 300 are designed such that the phase of the light transmitted therethrough is shifted to be substantially reversed with respect to that of the light transmitted through the light-transmitting areas (FIG. 1B). Light rays incident upon the vicinities of the border between a translucent area and a light-transmitting area are diffracted to invade and cancel out mutually. As a result, the light intensity in the border is reduced to practically zero thereby improving the contrast, namely, the resolution (FIG. 1C).

The translucent areas of a half-tone phase shift mask or a translucent film of a half-tone phase shift mask blank before patterning (the term "translucent film" will hereinafter be used to describe both the translucent film of a blank and the translucent areas of a mask) should have a suitable transmittance and cause a suitable phase shift as a phase shifter. Specifically, the translucent film should have (1) a controlled transmittance within a range of from 3 to 20% for an exposure wavelength of a KrF excimer laser, an ArF excimer laser, etc., (2) capability of shifting the phase of the light of the exposure wavelength usually by 180°, and (3) a sufficient transmittance (usually 65% or higher) for wavelengths used for mask inspection, e.g., 257 nm, 266 nm, 364 nm, and 488 nm.

Further, the translucent film should have sufficient resistance against acids (e.g., sulfuric acid) and alkali solutions (e.g., ammonia) because the blanks or masks are to be cleaned with an acid solution in a patterning process or on use.

It has been taught that molybdenum silicide oxynitride (MoSiON) is capable of forming a single-layered shifter showing the above-mentioned characteristics (see JP-A-6-214792 and Japanese Patent Nos. 2878143 and 2989156).

In order to secure a DOF in exposure, the translucent film of the half-tone phase shift mask or mask blank is also required not to have such a large internal stress as to deform the transparent substrate, on which the translucent film is formed. A sufficiently small internal stress is particularly demanded for use with an ArF excimer laser (wavelength: 193 nm).

However, as the wavelength used for exposure has become shorter and shorter (from i-rays (365 nm) to KrF laser rays (248 nm) and from KrF laser rays to ArF excimer laser rays (193 nm)), the above-described half-tone phase shift masks of related art and processes of fabricating them have turned out to involve the following problems.

After the light transmittance and the phase shift of the translucent film comprising molybdenum silicide oxynitride are once set to fit for an ArF excimer laser, they are liable to deviate from the set values when the blank or the mask is pretreated or cleaned in the fabrication process or on use because the conventional molybdenum silicide oxynitride film has insufficient resistance against an acid solution (e.g., sulfuric acid) and an alkali solution (e.g., ammonia).

Deviation of the phase shift depends on the change in thickness of the translucent film caused by cleaning during mask fabrication. Deviation of a phase angle is represented by formula (1):

$$[360(n-1)d]/\lambda \qquad (1)$$

wherein n is a refractive index of a translucent area at an exposure wavelength; d is a thickness change of the translucent area caused by cleaning with an acid or alkali solution; and λ is an exposure wavelength.

As is understood from formula (1), the shorter the exposure wavelength, the greater the phase angle deviation, with the thickness change being fixed. Accordingly, a phase shift mask should have an increased resistance to acids and alkali solutions with shortening of the exposure wavelength. That is, phase shift masks and their blanks for an ArF excimer laser are particularly required to have improved acid and alkali resistance for practical use.

Another problem is that laser light gains in energy with wavelength shortening to damage the translucent areas. It follows that the phase shift mask suffers from deviations in transmittance and phase shift from initially set values within the expected service life. Therefore, the phase shift mask for an ArF excimer laser is additionally required to have particularly improved durability against irradiation with an excimer laser.

As long as a KrF excimer laser is used as a light source, the state-of-the-art half-tone phase shift masks and blanks are practicable and yet desired to have improved resistance to acid solutions, alkali solutions, and irradiation with an excimer laser.

Accordingly, an object of the present invention is to provide a half-tone phase shift mask blank and a half-tone phase shift mask of which the translucent film has improved acid resistance, alkali resistance and resistance to excimer laser irradiation to cope with shortening of an exposure wavelength.

Another object of the present invention is to provide a half-tone phase shift mask blank and a half-tone phase shift mask of which the translucent film has improved acid resistance, alkali resistance and resistance to excimer laser irradiation over the state-of-the-art ones.

Conceivable approaches to improve acid resistance, alkali resistance and resistance to excimer laser irradiation of a phase shift mask include an alteration to the composition of the translucent film and an increase of the translucent film's density.

Seeing that an alteration to the translucent film's composition is greatly influential on the transmittance and the phase angle, a lot of labor will be involved for composition designing while fulfilling all the characteristics required of a phase shift mask blank. A process for obtaining an appropriate composition is disclosed in Japanese Patent 2989156 supra.

To increase the density of the translucent film, it is effective to reduce the pressure of the nitrogen-containing atmosphere in which the translucent film is formed by sputtering. Compared with the alteration to the composition, this approach is advantageous in that the influences on the transmittance and phase angle of the film can be minimized. In silicon nitride (SiN) film formation by sputtering, however, a reduction in pressure of the sputtering atmosphere results in an increase of internal stress of the film (*J. Electrochem. Soc.*, vol. 137, No. 5, pp. 1582–1587 (May, 1990)). The same problem arises in forming films having a high silicon nitride content, such as a molybdenum silicide nitride film or a molybdenum silicide oxynitride film as contemplated in the present invention.

Accordingly, still another object of the present invention is to provide a half-tone phase shift mask blank and a half-tone phase shift mask of which the translucent film has improved acid resistance, alkali resistance and resistance to excimer laser irradiation while maintaining the internal stress of the film within an acceptable range for the intended use.

SUMMARY OF THE INVENTION

A first aspect of the present invention is a half-tone phase shift mask blank which comprises a transparent substrate having provided thereon a translucent film comprising at least one thin layer containing silicon and at least one of nitrogen and oxygen and which is to be exposed to light whose center wavelength is 248 nm or shorter, wherein the translucent film is dense such that it has a center-line surface roughness (Ra) of 0.3 nm or smaller.

A second aspect of the present invention is a half-tone phase shift mask blank which comprises a transparent substrate having provided thereon a translucent film comprising at least one thin film containing silicon and at least one of nitrogen and oxygen and which is to be exposed to light whose center wavelength is 193 nm or shorter, wherein the translucent film is dense such that it has a center-line surface roughness (Ra) of 0.2 nm or smaller.

Another aspect of the present invention is a half-tone phase shift mask blank which comprises a transparent substrate having provided thereon a translucent film containing a metal, silicon, and at least one of nitrogen and oxygen and which is to be exposed to light whose center wavelength is 248 nm or shorter, wherein the translucent film is a film formed by sputtering a target containing the metal and silicon in an atmosphere containing at least one of nitrogen and oxygen and having a pressure of 0.2 Pa or lower and then heat-treating the formed film at a temperature of 200° C. or higher.

Yet another aspect of the present invention is a process of fabricating a photomask blank comprising a transparent substrate having provided thereon a single-layered or multi-layered thin film for patterning, which comprises forming at least one layer of the thin film by sputtering in an atmosphere having a pressure of 0.15 Pa or less.

DESCRIPTION OF THE PREFERRED EMBODIMENTS

The translucent film comprising at least one thin film containing silicon and nitrogen and/or oxygen which is provided on a transparent substrate is such a dense film as to have a center-line surface roughness (Ra) of 0.3 nm or smaller. This constitution brings about improvements on the translucent film in acid resistance, alkali resistance and excimer laser irradiation resistance thereby to provide a phase shift mask blank coping with shortening of an exposure wavelength. In view of the resultant effects, the Ra of the translucent film is preferably 0.25 nm or smaller, still preferably 0.2 nm or smaller, for use with exposure light whose center wavelength is 248 nm; and is preferably 0.2 nm or smaller, still preferably 0.15 nm or smaller, for use with exposure light whose center wavelength is 193 nm.

The translucent film can have a single layer structure or a multilayer structure composed of a low-transmission layer, a high-transmission layer, etc. which are designed to give a desired phase angle and a desired transmittance as a whole. To reduce the surface roughness of the translucent film, whether single-layered or multilayered, leads to denseness of the whole translucent film.

The single-layered translucent film preferably consists essentially of a metal, silicon, and nitrogen and/or oxygen.

The multilayered translucent film preferably comprises a high-transmission layer consisting essentially of silicon and nitrogen and/or oxygen or a high-transmission layer consisting essentially of a metal, silicon, and nitrogen and/or oxygen and a low-transmission layer comprising a metal selected from chromium, molybdenum, tantalum, titanium, tungsten, etc., an alloy of two or more of these metals, or an oxide, an nitride, an oxynitride, a silicide, etc. of these metals.

The translucent film having a double-layered structure will be described in more detail. Where the translucent film has two or more layers, materials having transparency (light-transmitting property) at an exposure wavelength and forming a high-transmission layer and materials having opacity (light-blocking property) at the exposure wavelength and forming a low-transmission layer are combined appropriately to provide a translucent film having a controlled transmittance.

The transparent materials which can be used to form a high-transmission layer should have optical characteristics satisfying condition formula (I) shown below. Condition formula (I) indicates that the translucent film has a transmittance of at least 3% at an exposure wavelength:

$$T \times (1-R) \times \exp(-4\pi k_1 d/\lambda) > 0.03 \qquad (I)$$

wherein T represents a transmittance of a transparent substrate at an exposure wavelength; R represents a reflectance of a translucent film at an exposure wavelength; $k_1$ represents an extinction coefficient of the transparent material at an exposure wavelength; d represents a film thickness giving a phase angle of 180° at an exposure wavelength (d≈□λ□/2/(n−1); λ represents an exposure wavelength; and n represents a refractive index of a translucent film at an exposure wavelength.

The opaque materials which can be used to form a low-transmission layer should satisfy condition formula (II):

$$k_2 > k_1 \qquad (II)$$

wherein $k_1$ is as defined above; and $k_2$ represents an extinction coefficient of the opaque material at an exposure wavelength.

In the invention, the above-specified denseness of the translucent film is achieved by reducing the pressure of a sputtering atmosphere in forming a translucent film comprising nitrogen (and/or oxygen) and silicon and, if desired, a metal by sputtering a target containing silicon and, if desired, the metal in an atmosphere containing nitrogen (and/or oxygen). A reduction in the pressure of the sputtering atmosphere makes it possible to improve the acid resistance, alkali resistance, and excimer laser irradiation resistance. A reduction to 0.2 Pa or lower is particularly effective. In some detail, effects are appreciable at a pressure of 0.15 Pa or less and particularly remarkable at a pressure of 0.1 Pa or less when an ArF excimer laser is used. With a KrF excimer laser, the pressure should be reduced to 0.2 Pa or less, at which effects are appreciable, and particularly remarkable effects are produced at a pressure of 0.15 Pa or less. Where the translucent film has a multi-layered structure, the effects contemplated in the invention will be obtained as far as at least a layer containing silicon and nitrogen and/or oxygen is formed by sputtering under the above-described pressure condition. It is more desirable that all the layers making up the multi-layered translucent film be formed under the specified pressure condition.

Surface roughness of the translucent film is also somewhat influenced by film thickness. In order for a single-layered film mainly comprising, for example, a metal, silicon and nitrogen to have an Ra of 0.3 nm or smaller, a preferred film thickness is 1000 A (angstrom) or less for use with a KrF excimer laser and 700 nm or less for use with an ArF excimer laser. For a single-layered film mainly comprising a metal, silicon, nitrogen, and oxygen to have an Ra of 0.3 nm or smaller, a preferred film thickness is 1200 A or less for use with a KrF excimer laser and 1000 A or less for use with an ArF excimer laser.

A reduction in pressure of the sputtering atmosphere results in an increase of the internal stress of the formed translucent film as stated above. Therefore, the substrate having formed thereon a translucent film is preferably subjected to a heat treatment to reduce the internal stress to a range acceptable for use as a phase shift mask blank or a phase shift mask. A higher heat treating temperature is more effective in reducing the internal stress. In the invention, a desired effect in reducing the internal stress can be exhibited at a heating temperature of 200° C. or higher.

Thus, a combination of the low-pressure film formation technique and the heat treatment brings about significant improvement in practicability.

In using, for example, a synthetic quartz square substrate of 6 in. (152 mm) inside length and 0.25 in. (6.35 mm) in thickness, the internal stress of a phase shift mask blank is suitably such that the change in flatness of the substrate caused by formation of a translucent film is 1 μm or smaller, which corresponds to a film stress of $2 \times 10^9$ Pa or less as calculated according to formula (2) described later. When a translucent film having a thickness of about 100 nm and having its transmittance and phase angle adjusted to fit for a KrF excimer laser has an internal stress of $2 \times 10^9$ Pa or less, the flatness change of the substrate caused by the translucent film formation can be reduced to about 1 μm or smaller. With the film thickness, transmittance and phase angle of the translucent film being adjusted to fit for an ArF excimer laser, the flatness change can be reduced to about 0.7 μm or smaller, whereby a sufficient DOF can be secured. The term "flatness change" as used herein means a difference in flatness of a transparent substrate before film formation and after film formation, and the term "flatness" as used herein is defined to be a difference in height from a reference plane between the highest point and the lowest point of a substrate in a flatness quality area (i.e., an area with an edge exclusion, e.g., of 3 mm). The flatness change is preferably not more than 0.5 μm, still preferably not more than 0.3 μm.

With the pressure of a nitrogen-containing sputtering atmosphere being adjusted to 0.2 Pa, the internal stress can be reduced to $2 \times 10^9$ Pa or less by a heat treatment at about 200° C. With the pressure being further reduced to 0.1 Pa, the internal stress can be reduced to $2 \times 10^9$ Pa or less by a heat treatment at about 350° C.

The flatness of a substrate can be measured by determining the profile of the substrate with an optical interference meter. The internal stress can be represented by formula (2):

$$Eb^2/[6(1-\nu)rd] \qquad (2)$$

wherein E represents a Young's modulus of a substrate; b represents a thickness of the substrate; ν represents a Poisson's ratio; r represents a change in curvature radius of the substrate; and d represents a thickness of a thin film.

If the heat treating temperature is further elevated to 500° C. or even higher, the transmittance of the translucent film will increase 30% or more over that before the heat treatment, and control for obtaining a desired transmittance will be difficult. In addition a heat treatment at an excessively high temperature is time-consuming for temperature rise and drop, resulting in reduced productivity. In order to sufficiently reduce the internal stress of the translucent film while avoiding these problems, a preferred treating temperature is 500° C. or lower, but higher temperatures can be used as long as the film transmittance is sufficiently controllable and the productivity is within an acceptable range.

From the standpoint of reduction in internal stress of the translucent film, the treating temperature is desirably 300° C. or higher, more desirably 350° C. or higher, most desirably 400° C. or higher.

Should the atmosphere for a heat treatment at 200° C. or higher contain oxygen, the surface of the translucent film is oxidized to induce a composition variation in the thickness direction, which can impair the advantage of the translucent film being single-layered. Accordingly, the atmosphere for a heat treatment at 200° C. or higher is preferably an inert gas atmosphere, such as nitrogen or argon.

The target of sputtering which can be used in the present invention can be made up of silicon and a metal. The metal is preferably at least one member selected from the group consisting of titanium, vanadium, niobium, molybdenum, tantalum and tungsten. Molybdenum is used frequently. Amongst the above-recited metals, molybdenum is particularly advantageous for transmittance control and target density. Titanium, vanadium and niobium are excellent in resistance against alkali solutions but slightly inferior to molybdenum in target density. Tantalum is excellent in resistance to alkali solutions and target density but slightly inferior to molybdenum in transmittance controllability. Tungsten is similar to molybdenum in performance but slightly inferior to molybdenum in discharge characteristics in sputtering.

It is preferred for the target to have a silicon content of 70 to 95 mol %. A target with a silicon content less than 70 mol % tends to result in formation of a thin film having too low a transmittance and unsatisfactory acid and alkali resistance. With a silicon content exceeding 95 mol %, a voltage is hardly applied to the target surface (erosion site) in DC sputtering so that the discharge tends to become instable or difficult to produce.

Even with a silicon content exceeding 95 mol %, a stable discharge can be obtained by RF sputter. However, since the space of RF plasma formed on the target is larger than the space of plasma formed by DC sputter, RF sputter is accompanied by the problem that the amount of particles which come off the inner wall near the target and enter the film increases. Further, ion beam sputtering also achieves stable film formation even with a target having a silicon content more than 95 mol % because a discharge between an anode and a cathode (target electrode) is not necessary. However, the sputtering rate of ion beam sputtering is lower than that of DC sputtering, resulting in reduced productivity. From all these considerations, DC sputtering is the most preferred.

In forming a single-layered translucent film fit for an ArF excimer laser, a preferred silicon content of the sputtering target is 88 to 95 mol %. For example, a target having an Si to Mo molar ratio of 88:12 to 95:5, particularly around 92:8, is preferred.

The present invention also provides a process of fabricating a photomask blank having a single-layered or multi-layered thin film for patterning, in which at least one layer of the thin film is formed by sputtering in an atmosphere having a pressure as low as 0.15 Pa or less to obtain a dense film. The term "thin film for patterning" as used herein is intended to include a light-blocking film in photomasks (e.g., a film of chromium or a chromium compound containing oxygen, nitrogen, carbon, etc. or other chromium compounds) as well as a single-layered translucent film (e.g., a film of a material comprising a metal, silicon, and nitrogen and/or oxygen or a film of chromium oxide, chromium fluoride, etc.) or double- or multi-layered translucent film (a combination of a high-transmission layer and a low-transmission layer and the like) of half-tone phase shift masks. Where the thin film for patterning has a multi-layered structure, although the effects contemplated in the invention will be obtained by forming at least one of the layers by sputtering under the above-specified pressure condition (0.15 Pa or less), it is more desirable that all the constituent layers be formed by sputtering under the specific pressure condition (0.15 Pa or less). To make the thin film for patterning denser is effective in improving not only chemical resistance (such as acid resistance and alkali resistance) and light resistance of the film but precision in making a microfine pattern. For making the thin film denser, a pressure of 0.1 Pa or lower is more desirable. In case DC sputtering is difficult to carry out under a pressure of 0.1 Pa or lower, ion beam sputtering is applicable instead.

The present invention will now be illustrated in greater detail with reference to embodiments.

Figure 2:
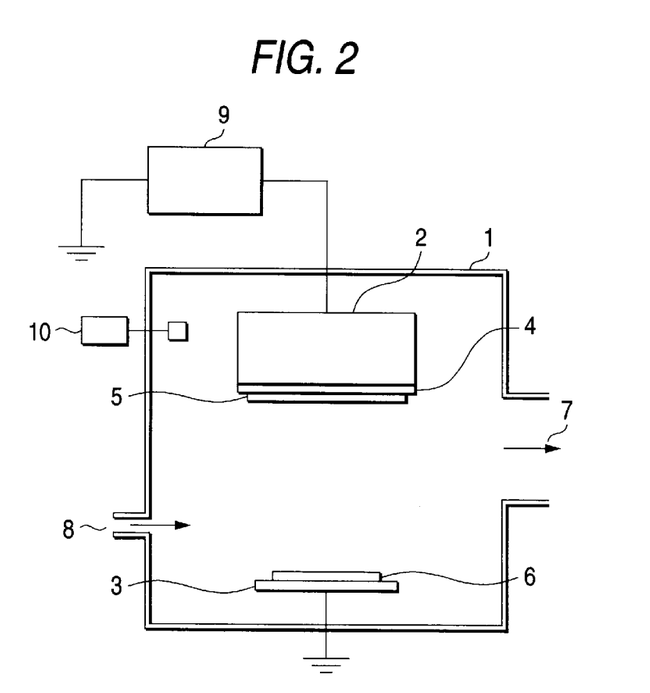
FIG. 2 schematically illustrates a DC magnetron sputtering system used in Examples.

Various half-tone phase shift mask blanks for an ArF excimer laser (193 nm) were fabricated by use of a DC magnetron sputtering system shown in FIG. 2.

The DC magnetron sputtering system shown in FIG. 2 has a vacuum chamber 1, in which a magnetron cathode 2 and a substrate holder 3 are disposed. A target 5 adhered to a backing plate 4 is attached to the magnetron cathode 2. In embodiments, oxygen-free copper was used as the backing plate 4, and indium was used for adhesion between the target 5 and the backing plate 4. The backing plate 4 is cooled directly or indirectly with a water cooling mechanism. The magnetron cathode 2, the backing plate 4, and the target 5 are electrically connected. A transparent substrate 6 is set on the substrate holder 3.

In carrying out sputtering, the vacuum chamber 1 is evacuated by a vacuum pump via a vacuum vent 7. After the atmosphere in the vacuum chamber 1 having reached the degree of vacuum that does not influence the characteristics of a film to be formed, a mixed gas containing nitrogen is introduced through a gas inlet 8. A negative voltage from a DC power source 9 is applied to the magnetron cathode 2 to conduct sputtering. The DC power source 9 is equipped with an arc detecting function, with which the discharge condition during sputtering is monitored. The pressure in the vacuum chamber 1 is monitored with a pressure gauge 10.

The transmittance of a translucent film formed on the transparent substrate is controlled by adjusting the kind and mixing ratio of the mixed gas introduced through the inlet 8. Where the mixed gas is a mixture of argon and nitrogen, the transmittance of the film formed increases with an increase in nitrogen ratio. Where adjustment of the nitrogen ratio is insufficient for obtaining a desired transmittance, it is possible to raise the transmittance by addition of oxygen to the nitrogen-containing mixed gas.

The phase angle of a translucent film formed is controlled by adjustment of the sputtering time. In embodiments 1 to 10, Reference Example 1 and Comparative Examples 1 to 5, the phase angle at the exposure wavelength is adjusted to about 180°.

Figure 3:
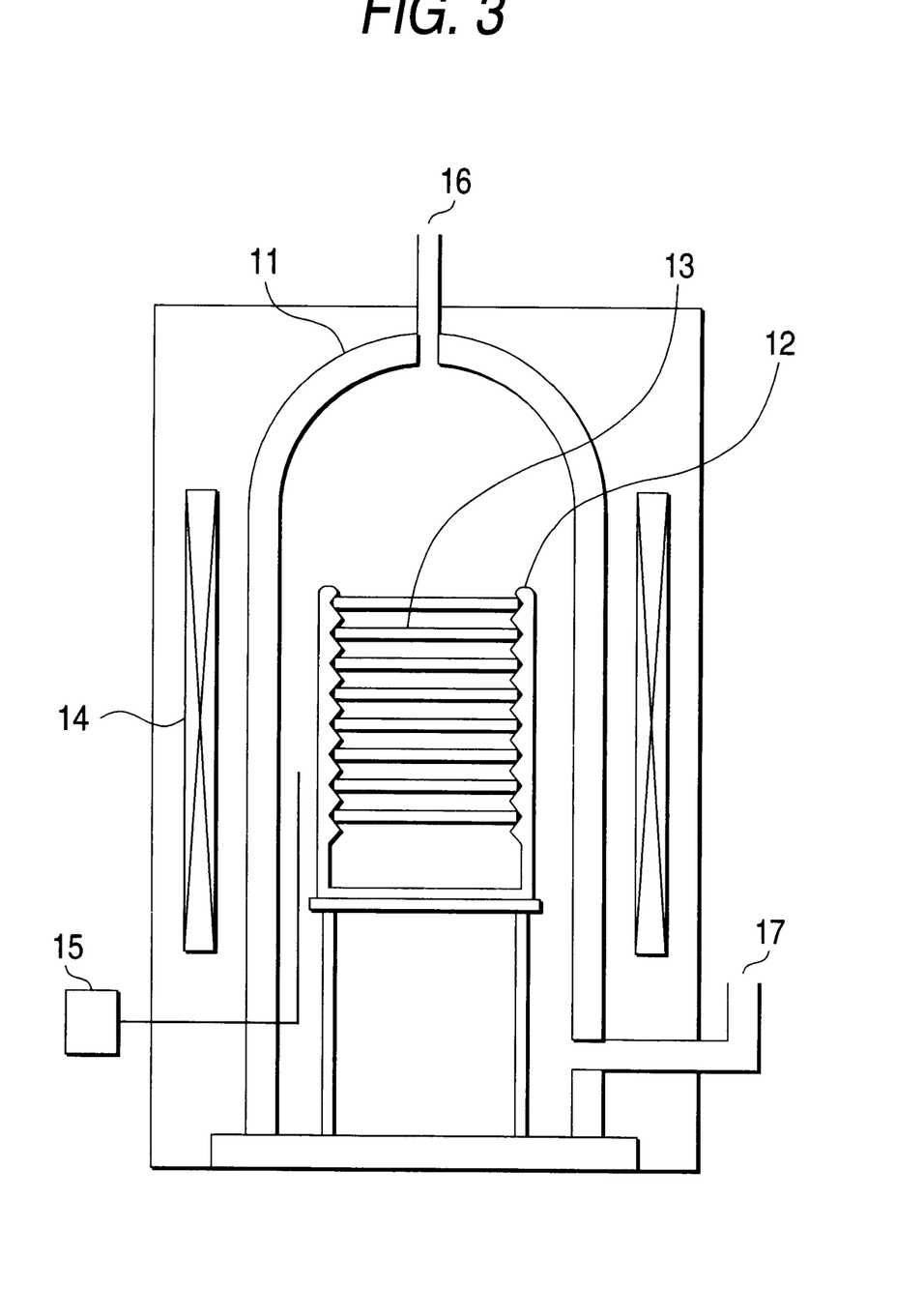
FIG. 3 schematically illustrates a vertical oven used in Examples.

The transparent substrate having a translucent film thus formed thereon is then subjected to a heat treatment in a vertical oven shown in FIG. 3. The vertical oven has a quartz tube 11, in which a quartz boat 12 is placed. A mask blank 13 is put on the quartz boat 12. The quartz tube 11 is heated by a heater 14 provided therearound. The mask blank 13 is thus heated by the heat radiated from the quartz tube 11.

The output of the heater 14 is controlled by the temperature of a thermocouple 15 placed in the quartz tube 11. An inert gas such as nitrogen is introduced into the quartz tube 11 through a gas inlet 16 and discharged out of the quartz tube 11 trough an outlet 17. The inert gas prevents the translucent film from being oxidized. The inert gas circulating in the quartz tube 11 helps heat transfer from the quartz tube 11 to the mask blank 13 through convection and reduces the temperature distribution in the tube 11.

In Table 1 below are shown the conditions for the above-described film formation and heat treatment adopted in embodiments 1 to 10, Reference Examples 1 to 3 and Comparative Examples 1 to 3. In these embodiments and Examples, the thickness of the translucent film is adjusted so as to provide a phase shift of about 180° at an exposure wavelength. The film thickness can be controlled by the output of the DC power source, the mixing ratio of the mixed gas, and the sputtering time. When the DC power source output and/or the gas mixing ratio is/are varied for the thickness control, not only the thickness but the refractive index and the transmittance of the film are also varied. Therefore, film thickness control by the sputtering time is more convenient and easier.

The resulting mask blanks were evaluated for various characteristics according to the methods described below. The results obtained are shown in Table 2.

The transmittance at an exposure wavelength (193 nm) is measured with a spectrophotometer.

The surface profile of the translucent film is measured under an atomic force microscope. A center-line surface roughness (Ra) is obtained from the height data of a 1 $\mu$m-side square site. The transparent substrate on which the translucent film is to be formed has an Ra of 0.1 to 0.13 nm.

The mask blank is immersed in hot concentrated sulfuric acid (96% $H_2SO_4$; 100° C.) for 120 minutes. A difference in phase angle between before and after the immersion is obtained to evaluate acid resistance. A negative difference in phase angle indicates a decrease in phase angle.

Alkali, RCA SCI treatment is carried out to the mask blank (29% $NH_3$:30% $H_2O_2$:$H_2O$=1:2:10 by volume; 25° C.) for 120 minuets. A difference in phase angle between before and after the treatment is obtained to evaluate alkali resistance. A negative difference in phase angle indicates a decrease in phase angle.

Each of the translucent films of embodiments 1 to 5, Reference Examples 1 to 3 and Comparative Examples 1 to 3 is irradiated with light of an excimer laser at a wavelength used for patterning exposure under conditions of 8 mJ/cm$^2$/pulse and 200 Hz to a cumulative energy quantity of 30 kJ/cm$^2$. An increase in transmittance due to irradiation is measured. In embodiments 6 to 10, the translucent film is irradiated with laser light of the same wavelength to a cumulative energy quantity of 13 kJ/m$^2$, and the resultant change in transmittance is compared with the transmittance changes measured in embodiments 1 to 5 to estimate a transmittance change after irradiation with a cumulative energy quantity of 30 kJ/cm$^2$.

The internal stress (film stress) of the translucent film is evaluated in terms of flatness change of the transparent substrate due to formation of the translucent film. A synthetic quartz square sheet of 6 in. (152 mm) in side length and 0.25 in. (6.35 mm) in thickness is used as a substrate. The flatness, expressed in terms of a difference in height from a reference plane between the highest point and the lowest point, of the substrate is measured with an optical interference meter (FlatMaster 200, supplied by Tropel Corp.) on a 146 mm-side square site (edge exclusion: 3 mm). Since most of the translucent films used in the present invention have a compressive stress, the translucent film side of the substrate is deformed into a convex. In such cases, it is advantageous for securing precision of measurement to use a transparent substrate having a convex surface on the translucent film side thereof. A positive value of a flatness change indicates that the internal stress of the film is compressive.

The state of a discharge is evaluated by the number of arcs generated as detected by the DC power source and graded A to D according to the following standards of judgement. A discharge state is judged satisfactory, denoted as 'A,' when no arc is detected during formation of translucent films. A discharge state is judged acceptable, denoted as either 'B' or 'C,' when an arc rarely generates during formation of a plurality of translucent films. When an arc generates, particles enter the translucent film, and the yield is reduced with the frequency of arc generation. When an arc is always detected during translucent film formation, or when such heavy arcing occurs even once during translucent film formation as to partially melt the surface of the target, the discharge state is regarded unsatisfactory and denoted as 'D'. In case of heavy arcing, a fine groove is formed on the target, and a film adhered to the groove comes off and enters the translucent film as particles.

TABLE 1

| | Metal/Si Target | | Atmosphere (%) | | | | Heat Treating |
|---|---|---|---|---|---|---|---|
| | Metal | Metal Ratio (mol %) | Ar | $N_2$ | $O_2$ | Pressure (Pa) | Temp. (° C.) |
| em. 1 | Mo | 8 | 20 | 80 | | 0.1 | 200 |
| em. 2 | Mo | 8 | 20 | 50 | 30 | 0.1 | 200 |
| em. 3 | Mo | 8 | 20 | 80 | | 0.1 | 400 |
| em. 4 | Mo | 8 | 20 | 50 | 30 | 0.1 | 400 |
| em. 5 | Mo | 8 | 10 | 90 | | 0.06 | 400 |
| em. 6 | Ti | 10 | 20 | 80 | | 0.1 | 400 |
| em. 7 | V | 10 | 20 | 80 | | 0.1 | 400 |
| em. 8 | Nb | 10 | 20 | 80 | | 0.1 | 400 |
| em. 9 | Ta | 10 | 20 | 80 | | 0.1 | 400 |
| em. 10 | W | 10 | 20 | 80 | | 0.1 | 400 |
| Comp. Ex. 1 | Mo | 8 | 20 | 80 | | 0.3 | 400 |
| Comp. Ex. 2 | Mo | 8 | 20 | 80 | | 0.3 | 150 |
| Comp. Ex. 3 | Mo | 8 | 20 | 70 | 10 | 0.3 | 400 |
| Ref. Ex. 1 | Mo | 8 | 20 | 80 | | 0.1 | 150 |
| Ref. Ex. 2 | Mo | 33 | 20 | 80 | | 0.1 | 400 |
| Ref. Ex. 3 | Mo | 4 | 20 | 80 | | 0.1 | 400 |

TABLE 2

|  | Exposure Wavelength (nm) | Transmittance (%) | Ra (nm) | Acid Resistance (°) | Alkali Resistance (°) | Irradiation Resistance (%) | Flatness Change (μm) | Discharge State | Film Thickness (Å) |
|---|---|---|---|---|---|---|---|---|---|
| em. 1 | 193 | 5.8 | 0.2 | −0.7 | −3.7 | +03.8 | +0.7 | A | 672 |
| em. 2 | 193 | 14.5 | 0.2 | −0.6 | −3.0 | +0.85 | +0.6 | B | 884 |
| em. 3 | 193 | 6.3 | 0.2 | −0.5 | −3.2 | +0.19 | +0.5 | A | 674 |
| em. 4 | 193 | 16.5 | 0.2 | −0.4 | −2.6 | +0.41 | +0.4 | B | 890 |
| em. 5 | 193 | 6.1 | 0.15 | −0.3 | −1.9 | +0.13 | +0.7 | A | 663 |
| em. 6 | 193 | 6.2 | 0.2 | −0.8 | −2.0 | +0.22 | +0.5 | C | 682 |
| em. 7 | 193 | 6.1 | 0.2 | −0.7 | −2.4 | +0.20 | +0.5 | C | 682 |
| em. 8 | 193 | 4.9 | 0.2 | −0.6 | −2.6 | +0.18 | +0.5 | C | 680 |
| em. 9 | 193 | 4.1 | 0.2 | −0.5 | −1.9 | +0.16 | +0.8 | A | 659 |
| em. 10 | 193 | 5.5 | 0.2 | −0.5 | −3.5 | +0.20 | +0.7 | B | 663 |
| Comp. Ex. 1 | 193 | 6.5 | 0.35 | −1.2 | −5.1 | +0.55 | +0.2 | A | 685 |
| Comp. Ex. 2 | 193 | 6.0 | 0.35 | −1.6 | −7.6 | +0.17 | +0.6 | A | 679 |
| Comp. Ex. 3 | 193 | 14.0 | 0.35 | −3.8 | −10.4 | +0.13 | +0.3 | B | 626 |
| Ref. Ex. 1 | 193 | 5.5 | 0.2 | −1.1 | −4.0 | +0.56 | +1.3 | A | 870 |
| Ref. Ex. 2 | 193 | 0.3 | 0.2 | −8.8 | −32.2 | +0.03 | +0.3 | A | 734 |
| Ref. Ex. 3 | 193 | 8.0 | 0.2 | −4.0 | −1.8 | +0.08 | +0.5 | D | 583 |

As is apparent from Tables 1 and 2, in embodiments 1 to 10, since the pressure of film formation is low, the films have small surface roughness and exhibit satisfactory acid resistance and alkali resistance. The films of embodiments 1 to 10 have a small film stress owing to the heat treatment at 200° C. or higher. The films of embodiments 1 and 2 where the heat treatment was at 200° C. show tendency to have a slightly greater film stress than those heat-treated at 400° C. The films of embodiments 3 and 4 where the sputtering atmosphere contained oxygen tend to have a slightly poorer irradiation resistance than those of other embodiments. The film of embodiment 5 where the pressure of film formation was the lowest shows the smallest surface roughness and exhibits the highest acid and alkali resistance. The film stress of embodiment 5 can be reduced by raising the heat treating temperature.

Thus, it is understood that the effects of the present invention are manifested to maximum to provide a phase shift mask with remarkably improved practicability by meeting all the conditions about the metal content in the translucent film (i.e., the metal content in the target; for example, an Mo content in the target of 5 to 12 mol %), the low pressure in film formation, the surface roughness (indicative of the film denseness), and the heat treating temperature.

Compared with embodiment 1, the film of Comparative Example 1 has larger surface roughness because of the higher pressure of film formation than in embodiment 1 and is therefore inferior in acid resistance and alkali resistance. The large surface roughness provides a large surface area subject to surface oxidation. The slightly poor irradiation resistance of the film of Comparative Example 1 is due to noticeable manifestation of the influences of the surface oxidation.

Similarly, the film of Comparative Example 2 has larger surface roughness because of the higher pressure of film formation and is therefore inferior in acid resistance and alkali resistance as compared with embodiment 1. Additionally, since the heat treating temperature is lower than in Comparative Example 1, the film has a higher film stress.

In Comparative Example 3, too, the film has larger surface roughness because of the higher pressure of film formation and is therefore inferior in acid resistance and alkali resistance as compared with embodiment 1. In Comparative Example 3 oxygen was introduced to increase the transmittance.

In Reference Example 1, although the surface roughness is small owing to the low pressure in film formation, the film stress is high due to the low heat treating temperature. Further, the film is slightly inferior in acid resistance, alkali resistance and irradiation resistance.

Where the metal content in the target exceeds 30 mol % as in Reference Example 2, the film has too low a transmittance and poor alkali resistance. Where the metal content is less than 5 mol % as in Reference Example 3, the target cannot maintain a stable discharge.

Incidentally, where the films of the foregoing embodiments and Examples were not subjected to the heat treatment, they had 1.3 to 2.5 times as much film stress as the respective values shown in Table 2.

For use with an ArF excimer laser (193 nm), it is preferred for the phase shift mask blank to have acid resistance of less than −3.0° in terms of a change in phase shift angle, alkali resistance of less than −3.0° in terms of a change in phase shift angle, excimer laser irradiation resistance of not more than 0.3% in terms of a change in transmittance (when irradiated with a cumulative energy quantity of 30 kJ/cm$^2$), and a film stress of not more than 0.5 μm in terms of a change in substrate's flatness after film formation.

Half-tone phase shift mask blanks fit for a KrF excimer laser (248 nm) are fabricated in the same manner as in embodiment 1, except that the thickness of the translucent film is adjusted so as to provide a phase shift of about 180° at an exposure wavelength, 248 nm (the thickness is larger than that required for an exposure wavelength of 193 nm). The film thickness can be controlled by the output of the DC power source, the mixing ratio of the mixed gas, and the sputtering time. The conditions of fabrication and the characteristics of the resulting mask blanks are shown in Tables 3 and 4, respectively.

TABLE 3

| | Metal/Si Target | | | | | |
|---|---|---|---|---|---|---|
| | | Metal Ratio | Atmosphere (%) | | Pressure | Heat Treating |
| | Metal | (mol %) | Ar | $N_2$ | $O_2$ | (Pa) | Temp. (° C.) |
| em. 11 | Mo | 20 | 30 | 70 | | 0.2 | 200 |
| em. 12 | Mo | 20 | 30 | 70 | | 0.2 | 400 |
| em. 13 | Mo | 20 | 25 | 75 | | 0.15 | 200 |
| em. 14 | Mo | 20 | 25 | 75 | | 0.15 | 400 |
| em. 15 | Mo | 20 | 20 | 80 | | 0.1 | 200 |
| em. 16 | Mo | 20 | 20 | 80 | | 0.1 | 400 |
| em. 17 | Mo | 20 | 30 | 70 | | 0.2 | untreated |
| em. 18 | Mo | 20 | 30 | 70 | | 0.2 | 150 |
| Comp. Ex. 4 | Mo | 20 | 30 | 70 | | 0.3 | 400 |
| Comp. Ex. 5 | Mo | 20 | 30 | 70 | | 0.3 | 150 |
| Ref. Ex. 4 | Mo | 33 | 20 | 80 | | 0.1 | 400 |
| Ref. Ex. 5 | Mo | 4 | 20 | 80 | | 0.2 | 400 |

TABLE 4

| | Exposure Wavelength (nm) | Transmittance (%) | Ra (nm) | Acid Resistance (°) | Alkali Resistance (° C.) | Irradiation Resistance (%) | Flatness Change (μm) | Discharge State | Film Thickness (A) |
|---|---|---|---|---|---|---|---|---|---|
| Ex. 11 | 248 | 5.8 | 0.3 | −1.8 | −15.0 | +0.18 | +0.6 | A | 932 |
| Ex. 12 | 248 | 6.3 | 0.3 | −1.3 | −11.0 | +0.05 | +0.4 | A | 935 |
| Ex. 13 | 248 | 5.7 | 0.25 | −1.3 | −13.2 | +0.15 | +0.8 | A | 924 |
| Ex. 14 | 248 | 6.1 | 0.25 | −0.8 | −9.2 | +0.04 | +0.5 | A | 928 |
| Ex. 15 | 248 | 5.4 | 0.2 | −0.9 | −10.6 | +0.13 | +1.0 | A | 919 |
| Ex. 16 | 248 | 5.9 | 0.2 | −0.5 | −7.4 | +0.04 | +0.7 | A | 720 |
| Ex. 17 | 248 | 5.3 | 0.3 | −3.7 | −22.4 | +0.70 | +1.2 | A | 928 |
| Ex. 18 | 248 | 5.5 | 0.3 | −3.0 | −19.6 | +0.54 | +1.1 | A | 931 |
| Comp. Ex. 4 | 248 | 6.5 | 0.4 | −2.5 | −13.5 | +0.52 | +0.3 | A | 945 |
| Comp. Ex. 5 | 248 | 6.0 | 0.4 | −4.5 | −21.8 | +1.20 | +0.6 | A | 940 |
| Ref. Ex. 4 | 248 | 2.0 | 0.25 | −6.5 | −23.7 | +0.31 | +0.3 | A | 990 |
| Ref. Ex. 5 | 248 | 24.3 | 0.3 | −0.7 | −1.9 | +0.17 | +0.6 | D | 888 |

It is preferred for phase shift mask blanks for use with a KrF excimer laser (248 nm) to have acid resistance of not more than −3.0° in terms of a change in phase shift angle, alkali resistance of not more than −15° in terms of a change in phase shift angle, excimer laser irradiation resistance of not more than 0.3% in terms of a change in transmittance (when irradiated with a cumulative energy quantity of 30 kJ/cm²), and a film stress of not more than 0.7 μm in terms of a change in substrate's flatness after film formation.

In order to fulfill the above-recited preferred conditions of acid resistance and alkali resistance, it is necessary, as can be seen from Tables 3 and 4, to reduce the film formation pressure to 0.2 Pa at the highest and to reduce the surface roughness Ra to 0.3 nm at the greatest as in embodiments 11 and 12. It is seen that further improvements in acid resistance and alkali resistance are obtained by reducing the pressure to 0.15 Pa or lower and reducing the surface roughness Ra to 0.25 nm as in embodiments 13 to 16.

The films of embodiments 17 and 18 have a high film stress because a heat treatment was not conducted (embodiment 17) or the heat treating temperature was low (embodiment 18).

As compared with embodiment 12, the film of Comparative Example 4 where the pressure of film formation was higher has larger surface roughness and is therefore inferior in acid resistance and alkali resistance.

The film of Comparative Example 5 has larger surface roughness and therefore poorer resistance to acid and alkali than the film of embodiment 18 because of the higher pressure in film formation. The film of Comparative Example 5 has higher film stress and is less resistant to irradiation than the film of Comparative Example 4 because of the lower temperature in the heat treatment.

Where the metal content in the target exceeds 30 mol % as in Reference Example 4, the film has too low a transmittance and poor alkali resistance. Where the metal content is less than 5 mol % as in Reference Example 5, the target cannot maintain a stable discharge.

The invention is further explained referring to embodiments 19 and 20, and comparative example 6.

A first thin layer (thickness; about 80 A) made of molybdenum and silicon (MoSi) is formed on a transparent substrate by reactive DC sputtering using a molybdenum-silicon mixed target (Mo:Si=8:92 by mol %) in an argon gas atmosphere having a pressure of 0.1 Pa. Subsequently, a second thin layer (thickness: about 86 A) of silicon oxynitride (SiON) is formed on the first layer by reactive DC sputtering using a silicon target in an argon-nitrogen-oxygen mixed gas. The gas mixing ratio is appropriately adjusted according to the pressure of the sputtering atmosphere.

The second layer in embodiments 19 and 20 have an Si:O:N atomic percent ratio of 32:53:15, and the composition of the first layer is adjusted so that the two layers as combined might exhibit optimum optical characteristics as a phase shift mask blank for an $F_2$ excimer laser (157 nm).

The transparent substrate having thereon a double-layered translucent film thus formed is subjected to a heat treatment in the same manner as in embodiments 1 to 10. The conditions of the second layer formation and the characteristics of the resulting phase mask blanks are shown in Tables 5 and 6, respectively.

TABLE 5

| | Atmosphere (%) | | | Pressure | Heat Treating |
|---|---|---|---|---|---|
| | Ar | N$_2$ | O$_2$ | (Pa) | Temp. (° C.) |
| em. 19 | 10 | 60 | 30 | 0.1 | 200 |
| em. 20 | 10 | 60 | 30 | 0.1 | 400 |
| Comp. Ex. 6 | 10 | 75 | 15 | 0.3 | 200 |

TABLE 5

| | Exposure Wavelength (nm) | Transmittance (%) | Ra (nm) | Acid Resistance (°) | Alkali Resistance (° C.) | Irradiation Resistance (%) | Flatness Change (μm) | Discharge State | Film Thickness (A) |
|---|---|---|---|---|---|---|---|---|---|
| em. 19 | 157 | 9.3 | 0.2 | −0.4 | −1.4 | +0.28 | +0.7 | A | 942 |
| em. 20 | 157 | 10.1 | 0.2 | −0.3 | −0.8 | +0.22 | +0.3 | A | 947 |
| Comp. Ex. 6 | 157 | 9.6 | 0.35 | −0.6 | −2.1 | +0.45 | +0.4 | A | 951 |

As demonstrated in Reference embodiment 5, where a target that is used to form a single-layered translucent film which comprises a metal and silicon has a metal content of less than 5 mol %, the state of a discharge for sputtering is unsatisfactory. This is because the target, being prepared by sintering a mixed powder of silicon and a silicide of the metal, has an electrically non-uniform composition with such a low metal content. To the contrary, a silicon target free of metal that is used to form a film mainly comprising silicon and nitrogen and/or oxygen is prepared by processing silicon crystals into the shape of a target and is therefore electrically uniform and capable of maintaining a satisfactory discharge state. Silicon targets used in DC magnetron sputtering usually contain a trace amount of boron, phosphorus, antimony, etc. to control the electric conductivity.

A resist film is formed (baking temperature: 190° C. for masks for F$_2$ or ArF lasers; 180° C. for masks for KrF lasers) on the translucent film of the phase shift mask blank. The resist is imagewise exposed and developed to form a resist pattern. The exposed area of the mask blank is dry etched in a mixed gas of CF$_4$ and O$_2$ to pattern the translucent film (i.e., to make holes, dots, etc. as translucent areas). The resist is stripped off, and the glass substrate with the patterned film is cleaned by immersion in 98% sulfuric acid at 100° C. for 15 minutes and rinsed with pure water, etc. to obtain a phase shift mask for an ArF excimer laser, a phase shift mask for a KrF excimer laser, and a phase shift mask for an F$_2$ laser.

While the present invention has been described by way of Examples, the present invention should not be construed as being limited thereto. For example, argon gas can be replaced with other inert gases, such as helium, neon or xenon. For producing half-tone phase shift masks or mask blanks for use with an F$_2$ excimer laser (157 nm) which comprise a single-layered translucent film, it is preferred to form an oxygen-containing translucent film, such as MoSiO, MoSiON, NiSiON and PdSiON, by sputtering in an oxygen-containing atmosphere.

According to the present invention, acid resistance, alkali resistance and resistance to excimer laser irradiation of the translucent film of a half-tone phase shift mask blank can be improved to cope with shortening of an exposure wavelength.

According to the invention, these improvements can be achieved while controlling the internal stress of the film within an acceptable range for practical use.

What is claimed is:

1. A half-tone phase shift mask blank which comprises a transparent substrate having provided thereon a translucent film comprising at least one thin layer containing silicon and at least one of nitrogen and oxygen and which is to be exposed to light whose center wavelength is 248 nm or shorter, wherein a packing density of said translucent film is high such that it has a center-line surface roughness (Ra) of 0.3 nm or smaller, wherein said translucent film has a double layer structure composed of a high-transmission layer consisting essentially of silicon and at least one of nitrogen and oxygen or a high-transmission layer consisting essentially of a metal, silicon, and at least one of nitrogen and oxygen, and a low-transmission layer.

2. A half-tone phase shift mask blank which comprises a transparent substrate having provided thereon a translucent film comprising at least one thin film containing silicon and at least one of nitrogen and oxygen and which is to be exposed to light whose center wavelength is 193 nm or shorter, wherein a packing density of said translucent film is high such that it has a center-line surface roughness (Ra) of 0.2 nm or smaller, wherein said translucent film has a double layer structure composed of a high-transmission layer consisting essentially of silicon and at least one of nitrogen and oxygen or a high-transmission layer consisting essentially of a metal, silicon, and at least one of nitrogen and oxygen, and a low-transmission layer.

3. A process of fabricating a photomask blank comprising a transparent substrate having provided thereon a single-layered or multi-layered thin film for patterning, which comprises forming at least one layer of the thin film by sputtering in an atmosphere having a pressure of 0.15 Pa or less.

4. A method of manufacturing a half-tone phase shift mask blank which has a transparent substrate having provided thereon a translucent film including at least one thin layer containing silicon and at least one of nitrogen and oxygen and which is to be exposed to light whose center wavelength is 248 nm or shorter, wherein a packing density of said translucent film is high such that it has a center-line surface roughness (Ra) of 0.3 nm or smaller, comprising:

heat-treating said translucent film at a temperature of 200° C. or higher.

5. A method of manufacturing a half-tone phase shift mask blank which has a transparent substrate having provided thereon a translucent film including at least one thin film containing silicon and at least one of nitrogen and oxygen and which is to be exposed to light whose center wavelength is 193 nm or shorter, wherein a packing density of said translucent film is high such that it has a center-line surface roughness (Ra) of 0.2 nm or smaller, comprising:

heat-treating said translucent film at a temperature of 200° C. or higher.

6. A method of pattern transfer comprising using the phase shift mask according to claims 4 or 5.

7. A method of manufacturing a half-tone phase shift mask blank which has a transparent substrate having provided thereon a translucent film including at least one thin layer containing silicon and at least one of nitrogen and oxygen and which is to be exposed to light whose center wavelength is 248 nm or shorter, wherein a packing density of said translucent film is high such that it has a center-line surface roughness (Ra) of 0.3 nm or smaller, comprising:

forming said thin film containing silicon and at least one of nitrogen and oxygen is formed by sputtering a target containing silicon in an atmosphere containing at least one of nitrogen and oxygen and having a pressure of 0.2 Pa or lower.

8. A method of manufacturing a half-tone phase shift mask blank which has a transparent substrate having provided thereon a translucent film including at least one thin film containing silicon and at least one of nitrogen and oxygen and which is to be exposed to light whose center wavelength is 193 nm or shorter, wherein a packing density of said translucent film is high such that it has a center-line surface roughness (Ra) of 0.2 nm or smaller, comprising:

forming said thin film containing silicon and at least one of nitrogen and oxygen by sputtering a target containing silicon in an atmosphere containing at least one of nitrogen and oxygen and having a pressure of 0.15 or lower.

9. The method of manufacturing a half-tone phase shift mask blank according to any one of claims 4–8, wherein said thin film containing silicon and at least one of nitrogen and oxygen further contains a metal.

10. The method of manufacturing a half-tone phase shift mask blank according to any one of claims 4–8, wherein said translucent film is a single-layered film consisting essentially of a metal, silicon, and at least one of nitrogen and oxygen.

11. The method of manufacturing a half-tone phase shift mask blank according to any one of claims 4–8, wherein said translucent film has a double layer structure composed of a high-transmission layer consisting essentially of silicon and at least one of nitrogen and oxygen or a high-transmission layer consisting essentially of a metal, silicon, and at least one of nitrogen and oxygen and a low-transmission layer.

12. The method of manufacturing a half-tone phase shift mask blank according to claim 11, further comprising: forming said thin film of at least one of nitrogen and oxygen by sputtering a target containing said metal and 70 to 95 mol % of silicon.

13. The method of manufacturing a half-tone phase shift mask blank according to claims 7 or 8, further comprising: heat-treating said translucent film at a temperature of 200° C. or higher.

14. A method of manufacturing a translucent film of a transparent substrate of a half-tone phase shift mask blank, said translucent film containing a metal, silicon, and at least one of nitrogen and oxygen and which is to be exposed to light whose center wavelength is 248 nm or shorter, comprising:

sputtering a target containing said metal and silicon in an atmosphere containing at least one of nitrogen and oxygen and having a pressure of 0.2 Pa or lower to form said translucent film; and heat-treating the translucent film at a temperature of 200° C. or higher.

* * * * *